United States Patent [19]
Chow

[11] Patent Number: 5,917,348
[45] Date of Patent: Jun. 29, 1999

[54] CMOS BIDIRECTIONAL BUFFER FOR MIXED VOLTAGE APPLICATIONS

[75] Inventor: Hwang-Cherng Chow, Hsinchu, Taiwan

[73] Assignee: Industrial Technology Research Institute—Computer & Communication Research Labs., Hsinchu, Taiwan

[21] Appl. No.: 08/922,469

[22] Filed: Sep. 2, 1997

[51] Int. Cl.[6] .................................................. H03K 3/00
[52] U.S. Cl. .......................... 327/108; 327/390; 327/437; 327/589
[58] Field of Search .......................... 327/108–112, 333, 327/374–377, 170, 434, 436, 437, 390, 589; 326/88

[56] References Cited

U.S. PATENT DOCUMENTS

| | | | |
|---|---|---|---|
| 4,491,748 | 1/1985 | Chappell et al. | 327/109 |
| 4,859,870 | 8/1989 | Wong et al. | 327/108 |
| 5,128,563 | 7/1992 | Hush et al. | 326/86 |
| 5,557,229 | 9/1996 | Eitan | 327/112 |
| 5,604,454 | 2/1997 | Maguire et al. | 327/108 |

FOREIGN PATENT DOCUMENTS

WO 94/18755  8/1994  WIPO ..................................... 327/108

*Primary Examiner*—Kenneth B. Wells
*Attorney, Agent, or Firm*—Proskauer Rose LLP

[57] ABSTRACT

In a preferred embodiment of the present invention, a bidirectional buffer connects a first device, such as a CMOS chip having a first voltage, such as VCC, to a second device having a second voltage, such as VDD, through a terminal pad. The buffer includes a bootstrap capacitor to assist in driving up the terminal pad. In particular, the buffer comprises an output and an input portion. The output portion includes a first driver for driving the terminal pad up to VDD and a second driver for driving the terminal pad down to VSS. The first driver includes a pull-up PMOS transistor and a pull-up NMOS transistor connected in series and the second driver includes a pull-down NMOS transistor. Further, preferably one pair of push-pull bootstrap control transistors are connected in parallel to the gate of the pull-up NMOS transistor for quickly driving up the first driver to a voltage level based on the bootstrap capacitor having a predetermined capacitance. The input portion includes an invertor and a protection resistor for protecting the invertor from static charges.

34 Claims, 9 Drawing Sheets

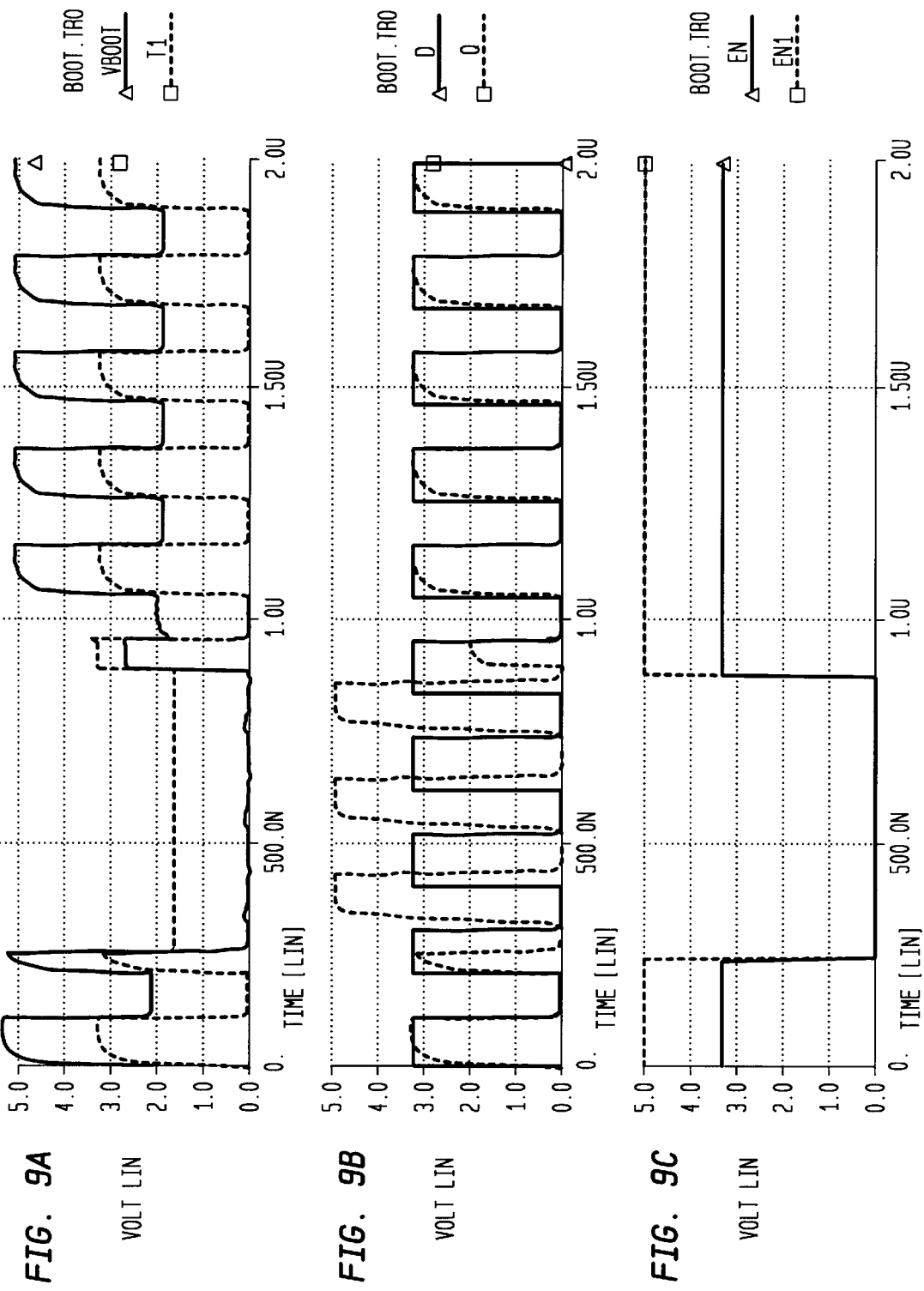

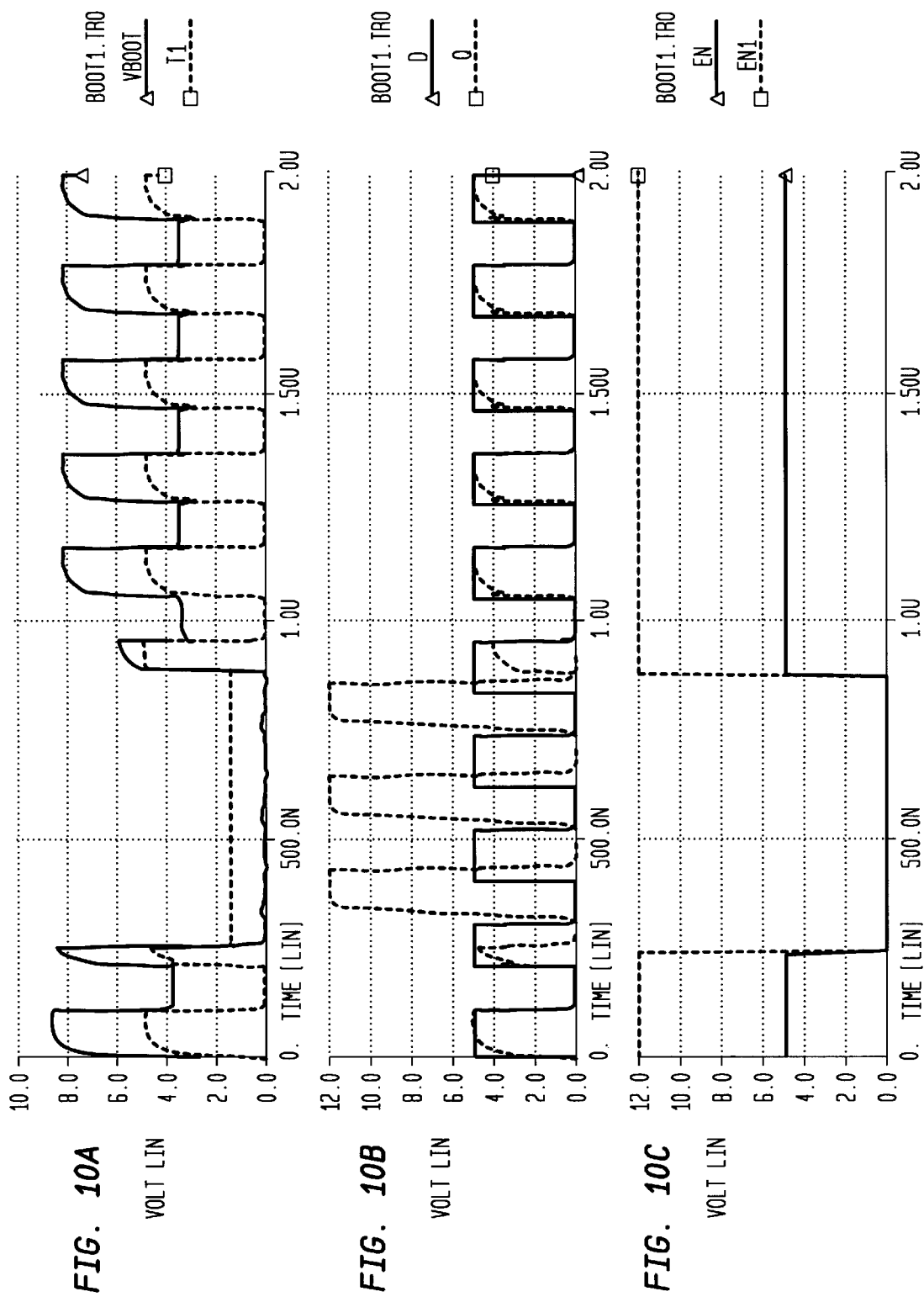

CMOS BIDIRECTIONAL BUFFER FOR MIXED VOLTAGE APPLICATIONS

FIELD OF THE INVENTION

The present invention relates to CMOS integrated circuits, and, more particularly, it relates to a bidirectional CMOS buffer circuit, having a bootstrap capacitor, suitable for different voltage level interface applications.

BACKGROUND OF THE INVENTION

An integrated circuit includes internal circuitry which generates a digital output signal for transmission to other external circuits. In order to generate the requisite voltage on the output signal pins of the integrated circuit (IC), the IC is typically provided with one or more output buffers. The output buffer has large current driving capacity transistors which can drive a terminal or pad, connected to the output signal pin, to the requisite voltage (i.e., high or low) for conveying the correct logic value (i.e., logic '1' or logic '0') of the output signal.

Recently, power reduction in ICs has become a priority. The most clear sign of this trend is the reduction of the standard power supply voltage VDD from 5 V to 3.3 V. In addition, there has also been a trend to reduce the power of a 12 V supply voltage to 5 V. With respect to the reduction 5 V to 3.3 V, since P=VI, a DC voltage reduction from 5 V to 3.3 V translates into a power savings of approximately forty percent (with 12 V to 5 V having a savings of approximately sixty percent). However, during the long anticipated transition period to completely convert from 5 V to 3.3 V, both 5 V and 3.3 V digital ICs will be used in system and board designs. For example, a systems memory may operate with a 3.3 V power supply but its monitor may require 5 V. Thus, a multi-voltage buffer is desired that can supply 5 V and 3.3 V signals as required.

FIG. 1 shows a conventional 3.3 V bidirectional (input/output) buffer circuit 10. Buffer circuit 10 comprises two stages; the input buffer stage 20 and the output buffer stage 30. Depending on the value of the Output Enable (OEN) control signal, the bidirectional buffer may act as an input buffer or as an output buffer. For example, when the OEN signal has a value of logic '1', buffer circuit 10 acts as an input buffer, and when the OEN signal has a value of logic '0', buffer circuit 10 acts as an output buffer. During the input phase, the driver transistors P1 and N1 are both off since the voltage levels at their respective gates are VDD and VSS, respectively. However, when a 5 V input signal is applied on pad 15, two conducting paths to the 3.3 V power supply will appear (as indicated by arrows 35 and 40). First, the parasitic diffusion diode D1 connected to the N-well of transistor P1 will open (become forward biased). Second, P1 itself will conduct current from pad 15 to the 3.3 V power source VDD since its gate-to-drain voltage is larger than its threshold voltage (in absolute value). Therefore, hazards, such as functional failure, may occur due to the loading value of the input signal and due to the reverse current in the power supply.

To eliminate the first conducting current path 40, the N-well of transistor P1 has to be tied to the 5 V power supply. However, the second conducting current path 35 remains. In addition, this arrangement results in other disadvantages including requiring dual power sources in the corresponding chip (e.g., 3.3 V/5 V or 5 V/12 V) and requiring an additional bonding pad for connecting the P1's N-well to the external power source.

FIG. 2 shows another conventional bidirectional buffer circuit as described in "5 V Compatibility with 3.3 V-Only CMOS ASICs", Microelectronics Journal, Vol 23, No. 8, 1992 by Henderson and Gal. Specifically, buffer circuit 50 includes a PMOS transistor Ti formed in an N-well that is connected to a 5 V power source 80 to avoid a forward biased condition on its parasitic diode. Furthermore, NMOS transistors T2 and T4/T5 reduce the stress voltage located at the drain of transistor T3 and at the gate of input buffer invertor 60, respectively. However, as with buffer circuit 10, the disadvantages of buffer circuit 50 include requiring dual power sources in the corresponding chip and requiring an additional bonding pad for connecting the P1's N-well to the external power source. Further, a leakage current flows at transistor Ti from pad 70 to the 3.3 V power source 90.

Another conventional buffer circuit is described in U.S. Pat. No. 5,300,835 to Assar et al. and is shown in FIG. 3. In buffer circuit 200, data DO and enable signal OEN* are first translated to voltage level NVDD by utilizing voltage translators. The voltage translator for signal DO comprises an invertor consisting of transistors 270 and 271 and cross wired transistors 266–269. The voltage translator for signal OEN* comprises an invertor consisting of transistors 276 and 277 and cross-wired transistors 272–275. Accordingly, PMOS driver transistor 250 can be completely off even when a high input signal, having a voltage level at NVDD, is applied to the pad. Although, unlike buffer circuit 10, the conducting current paths are eliminated, the buffer circuit 200 requires at least two power sources which require additional chip real estate for the supplemental power lines, bonding pad and connecting pins.

FIG. 4 is a further conventional bidirectional buffer circuit which is disclosed in "A 3/5 V Compatible I/O Buffer", IEEE Journal of Solid-State Circuits, July 1995 by Pelgrom and Dijkmans. As described in the disclosure, buffer circuit 100 provides the advantages of having a single power source and a single bonding pad, while exhibiting no leakage current of transistor P1. Buffer circuit 100 is fabricated using a 'floating N-well' circuit technique. That is, the PMOS transistors P1–P8 are formed in a floating N-well.

In operation, when buffer circuit 100 acts as an output buffer, the floating N-well is normally biased to 3.3 V to keep the diffusion diode (at each PMOS transistor's p-n junction) reverse biased. In this condition, control signal OEN is logic '0' and transistor P4 is turned-on to charge the floating N-well to 3.3 V (transistor N6 passes the logic '0' value to the gate of transistor P4). Conversely, when OEN is logic '1', buffer circuit 100 acts as an input buffer. When a 5 V input is applied, the floating N-well is directly charged to (5 V–$V_{diodedrop}$=4.3 V), where $V_{diodedrop}$ is the voltage drop of diode DI. When a 0 V input is applied, the voltage level of the floating N-well is discharged to (3.3+|Vt|) volts at PMOS transistor P6, where Vt is the threshold of transistor P6. Since the voltage level of the floating N-well is switched between two different values, buffer circuit 100 may induce latch-up. In addition, buffer circuit 100 is rather complex and requires a relatively large layout area.

It is therefore the object of the present invention to provide a simple circuit design for a bidirectional multi-voltage buffer.

A further object of the present invention is to minimize the leakage current between the bonding pad and the power source.

An additional object of the present invention is to design a bidirectional buffer having a single power source.

Another object of the present invention is to design a bidirectional buffer having a single bonding pad.

Yet a further object of the present invention is to minimize latch-up of a bidirectional buffer.

Yet an additional object of the present invention is to ensure that the buffer stress voltage (i.e., the AC stress) is less than the oxide breakdown voltage of a corresponding gate oxide.

SUMMARY OF THE INVENTION

These and other objects are achieved by the present invention. The present invention provides a bidirectional buffer for connecting a first device, such as a CMOS chip having a first voltage, such as VCC, to a second device having a second voltage, such as VDD, through a terminal pad. The buffer includes a bootstrap capacitor to assist in driving up the terminal pad. In particular, the buffer comprises an output and an input portion. The output portion includes a first driver for driving the terminal pad up to VDD and a second driver for driving the terminal pad down to VSS. The first driver includes a pull-up PMOS transistor and a pull-up NMOS transistor connected in series and the second driver includes a pulldown NMOS transistor. Further, preferably one pair of push-pull bootstrap control transistors are connected in parallel to the gate of the pull-up NMOS transistor for quickly driving up the first driver to a voltage level based on the bootstrap capacitor having a predetermined capacitance. The input portion includes an invertor and a protection resistor for protecting the invertor from static charges.

The bootstrap capacitor is preferably formed from the inherent overlapped capacitance of the pull-up NMOS transistor. However, if the capacitance is not sufficient, an additional CMOS transistor, connected in series with the pull-up NMOS transistor, may be added.

In a second embodiment, the input portion further includes an NMOS transistor, having its gate connected to VDD and one of its drain and source connected to the protection resistor and the other of its drain and source connected to the invertor, for reducing stress voltages applied to the invertor. Further, the output portion further includes an NMOS transistor, connected in series between the pull-up NMOS transistor of the first driver and the pull-down NMOS transistor of the second driver, for improving the stress voltages applied to the drain of the pull-down NMOS transistor.

In a third embodiment, the bidirectional buffer is formed on a first integrated circuit, such that the terminal pad of the buffer is connected to an output driver of a second integrated circuit through a pull-up resistor.

BRIEF DESCRIPTION OF THE DRAWINGS

The following detailed description, given by way of example and not intended to limit the present invention solely thereto, will best be understood in conjunction with the accompanying drawings, where similar elements will be represented by the same reference symbol, in which:

FIG. 9 illustrates voltage over time simulation results for a 3.3 V/5 V application of the circuit of FIG. 5; and FIG. 10 illustrates voltage over time simulation results for a 5 V/12 V application of the circuit of FIG. 5.

DETAILED DESCRIPTION OF THE INVENTION

Figure 1:
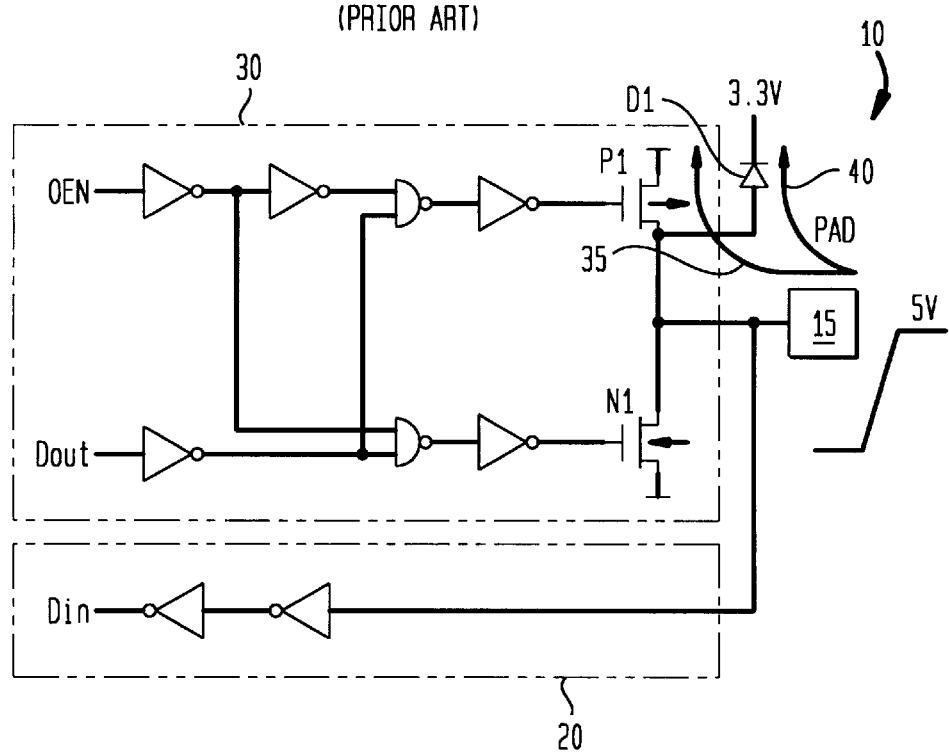
FIG. 1 shows a first conventional bidirectional buffer.
Figure 2:
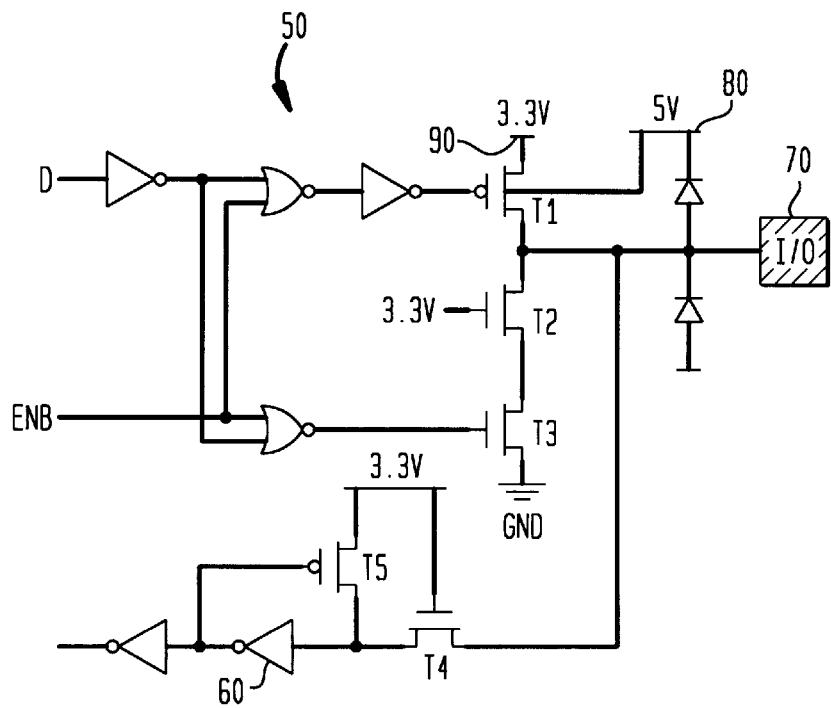
FIG. 2 shows a second conventional bidirectional multi-voltage buffer.
Figure 3:
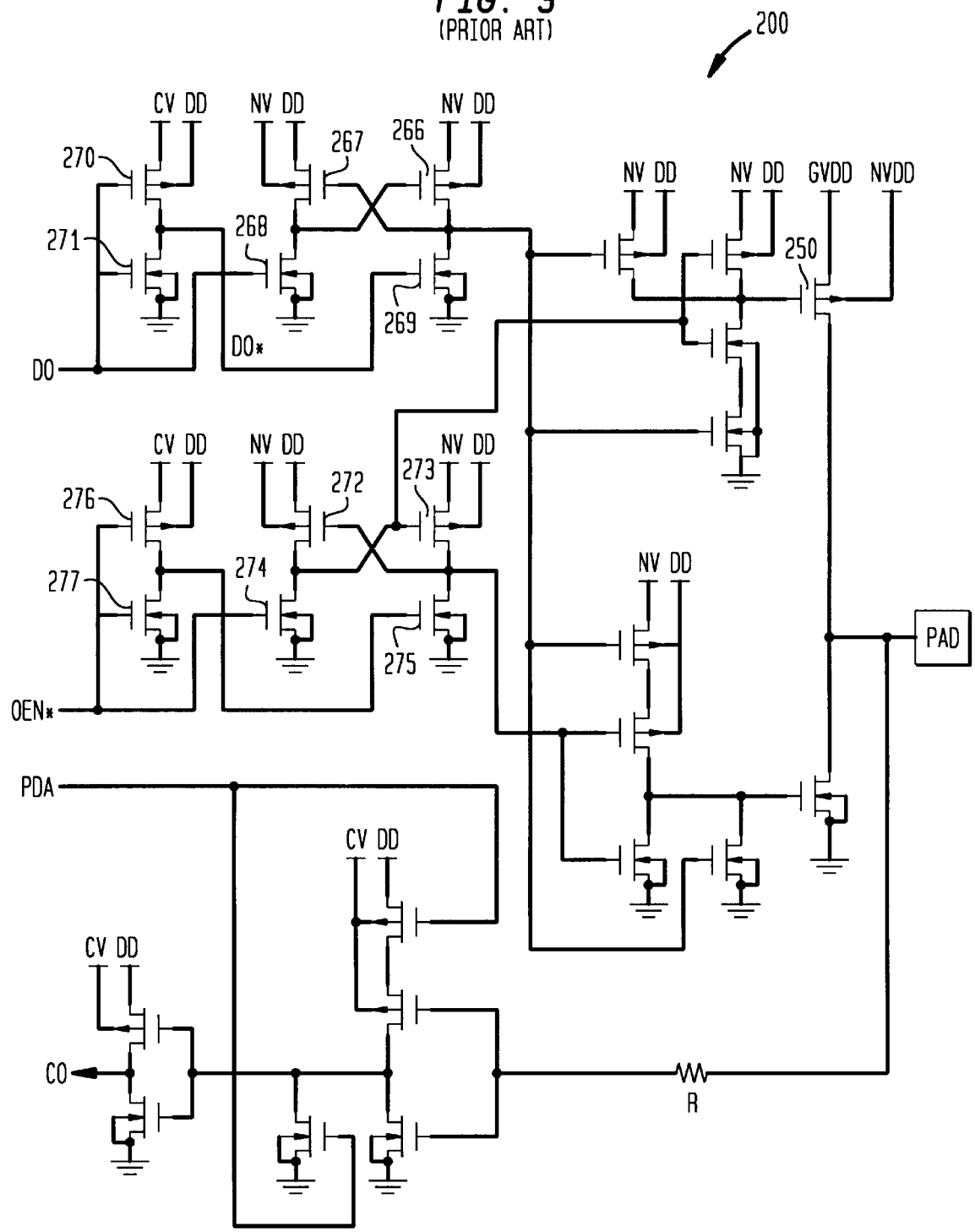
FIG. 3 shows a third conventional bidirectional multi-voltage buffer.
Figure 4:
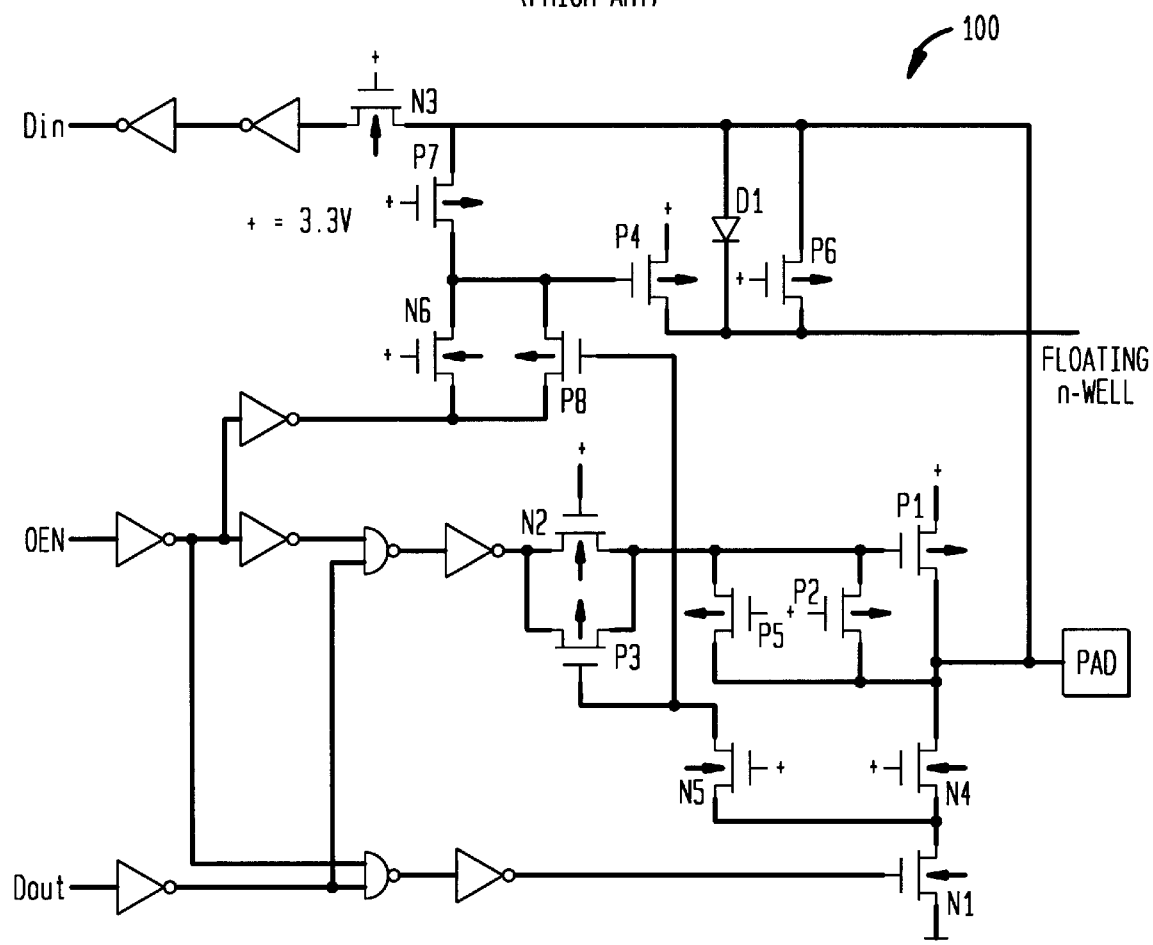
FIG. 4 shows a fourth conventional bidirectional multi-voltage buffer.
Figure 5:
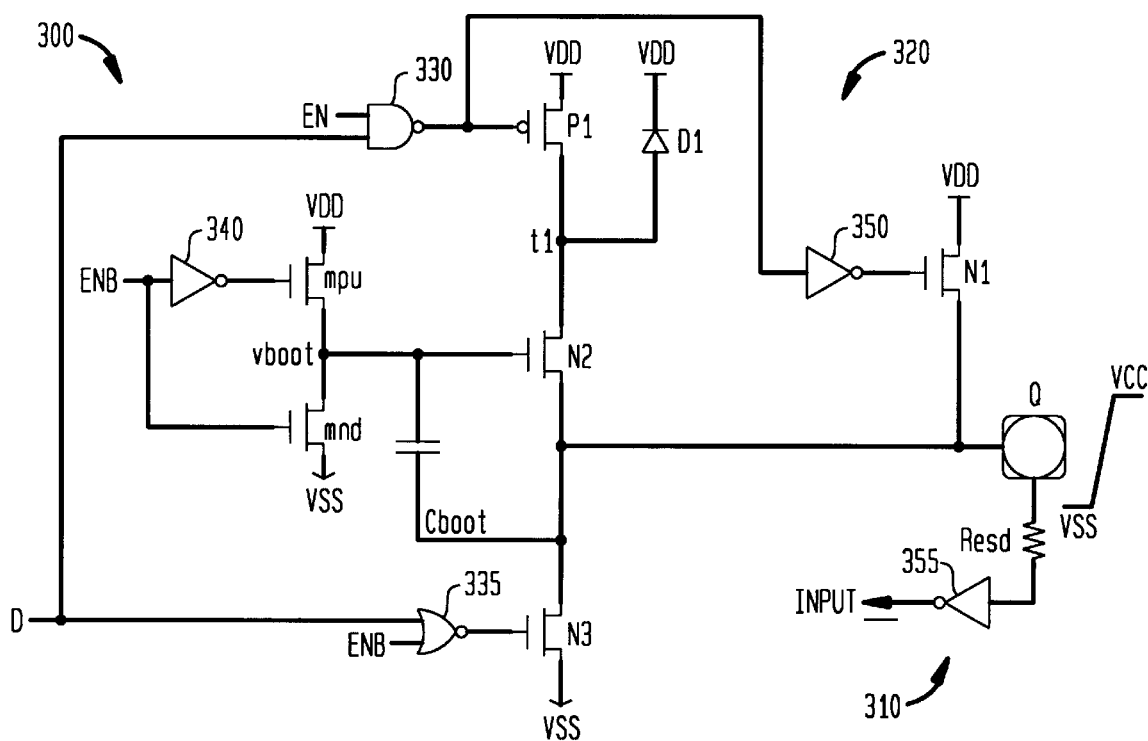
FIG. 5 shows a bidirectional multi-voltage buffer according to a first embodiment of the present invention.

FIG. 5 shows a bidirectional multi-voltage buffer circuit 300 according to a first embodiment of the present invention. Although each transistor in buffer 300 is illustrated as either n- or p-type, it should be understood that the conductivity type is interchangeable with little or no modification.

As shown, buffer 300 comprises an output buffer portion 320 for driving bonding pad Q and an input buffer portion 310 for receiving signals from pad Q. Output buffer portion 320 includes pull-up driver transistors N1, P1 and N2, pull-down driver transistor N3, predrivers NAND and NOR gates 330 and 335, respectively, 'bootstrap' capacitor Cboot, NMOS bootstrap control transistors mpu and mnd, parasitic diode D1, and invertors 340 and 350. Input buffer portion 310 includes an electro-static discharge protection resistor Resd and an invertor 355. Illustratively, each of the invertors 340, 350 and 355 includes a PMOS transistor connected to a NMOS transistor in a standard "push-pull" invertor configuration (not shown).

In buffer 300, output signal D is supplied to NAND gate 330 and NOR gate 335. Output signal D rises and falls from logic '0' to '1', as desired. Thus, when signal D is high, buffer 300 will output a high voltage at pad Q. Conversely, when signal D is low, buffer 300 will output a low voltage at the pad (typically 0 V). Along with signal D, enable control signal EN and enable control signal complement ENB are supplied to NAND gate 330 and NOR gate 335, respectively. The enable control signal determines whether buffer 300 will act in its input or in its output mode. Preferably, when EN=1 (and ENB=0), the buffer is in its output mode. Similarly, when EN=0 (and ENB=1), the buffer is in its input mode.

The output of the NAND gate is supplied to NMOS transistor N1 (via invertor 350) and PMOS transistor P1, while the output of the NOR gate is supplied to NMOS transistor N3. In addition, signal ENB is supplied to the bootstrap control transistors mpu (via invertor 340) and transistor mnd. These control transistors act as push-pull transistors to quickly drive the voltage level at the gate of N2 to the level at node vboot. Further, the drains of transistors P1 and N1 are connected to diode D1.

The operation of buffer 300 will now be described. Consider when EN=1 and ENB=0, so that buffer 300 is in its output mode. In this condition, transistor mpu is turned on and transistor mnd is off. Thus, node vboot is charged to a voltage level of VDD-Vt, where Vt is the threshold voltage of transistor mpu. Assume that initially the output at pad Q is 0, i.e., signal D=0. When signal D transitions from '0' to '1', the output of NOR gate 335 decreases, so transistor N3 turns off. Simultaneously, the voltage level at the gate of transistor N1 is logic '1' (since the output of NAND gate 330 is '0' that is inverted in invertor 350), such that transistor N1 turns on to charge the output pad Q. Further, since the output of the NAND gate is '0', transistor P1 turns on. As the voltage at pad Q increases, the voltage level at node vboot increases proportionally (since the voltage difference between the two terminals of capacitor Cboot must maintain the same value). The increase of the voltage level at node vboot causes transistor N2 to turn-on faster. Note that the final voltage level at node vboot is designed to be larger than (VDD+Vt) to pass a logic '1' of VDD (full power) to pad Q, where Vt is the threshold voltage of transistor N2. The capacitance of capacitor Cboot helps control the level at node vboot. At this stage, the output of pad Q is charged to VDD. VDD may be set at 3.3 V or 5 V in a 3.3 V/5 V application, at 5 V or 12 V in a 5 V/12 V application, or other maximum voltage levels as desired.

Subsequently, when D transitions from '1' to '0', the output of the NOR gate increases, so transistor N3 turns on. Simultaneously, the voltage level at the gate of transistor N1 is logic '0', such that transistor N1 turns off. The output of the NAND gate is now logic '1', such that transistor P1 also turns off. Since transistor N3 (the pull-down transistor) is on, the output at pad Q fully discharges to VSS (e.g., 0 V). Note too that the voltage level at node t1 (located at the drain of transistor P1) is also at VSS.

Now consider when EN='0' and ENB='1', so that buffer 300 is in its input mode. In this condition, transistor mpu is off and transistor mnd is turned on which discharges the voltage level at node vboot. Further, transistors P1, N1 and N3 all turn off. When the input signal applied to pad Q is at a high voltage (e.g., VCC=5 V, 12 V, etc. ), the voltage level at node t1 is designed to be smaller than (VDD+$V_{diodedrop}$) to ensure that the diode D1 (P1's drain diffusion to its N-well) is reverse biased. Accordingly, the voltage level of the pad Q can be sustained at VCC. Therefore, the major design concern is to control the voltage level at node t1. This is accomplished by simply adjusting the strength of the control pull-down transistor mnd.

The input signals may then be driven to the system core via electro-static discharge protection resistor Resd and invertor 355. Basically, protection resistor Resd is used to protect the gate oxide of the transistors in invertor 355 from static charges that suddenly occur from handling a device. The resistor absorbs some of the energy that is transferred into the integrated circuit from an external source. Invertor 355 ensures that the polarity presented to the system's core logic is the same as the polarity at pad Q and provides additional drive.

With respect to stress voltages (AC stresses) of buffer 300 during its output mode, although the voltage level at the gate of transistor N2 is larger than VDD (due to the bootstrap capacitor technique), the stress voltage is still far less than the oxide breakdown voltage of the gate. Process parameters, i.e., gate oxide thicknesses ($t_{ox}$), and simulated voltages at node vboot are summarized below:

(1) 5 V: 0.6 μm process, $t_{ox}$=141 Å, $V_{vboot}$<8.5 V; (5 V/12 V application)

(2) 5 V: 0.5 μm process, $t_{ox}$=128 Å, $V_{vboot}$<8.5 V; (5 V/12 V application)

(3) 3.3 V: 0.5 μm process, $t_{ox}$=104 Å, $V_{vboot}$<5.5 V; (3.3 V/5 V application)

Furthermore, advanced process technologies, such as 0.35 μm processes, usually provide thicker gate oxide transistors which improves the ESD protection capability.

Figure 6:
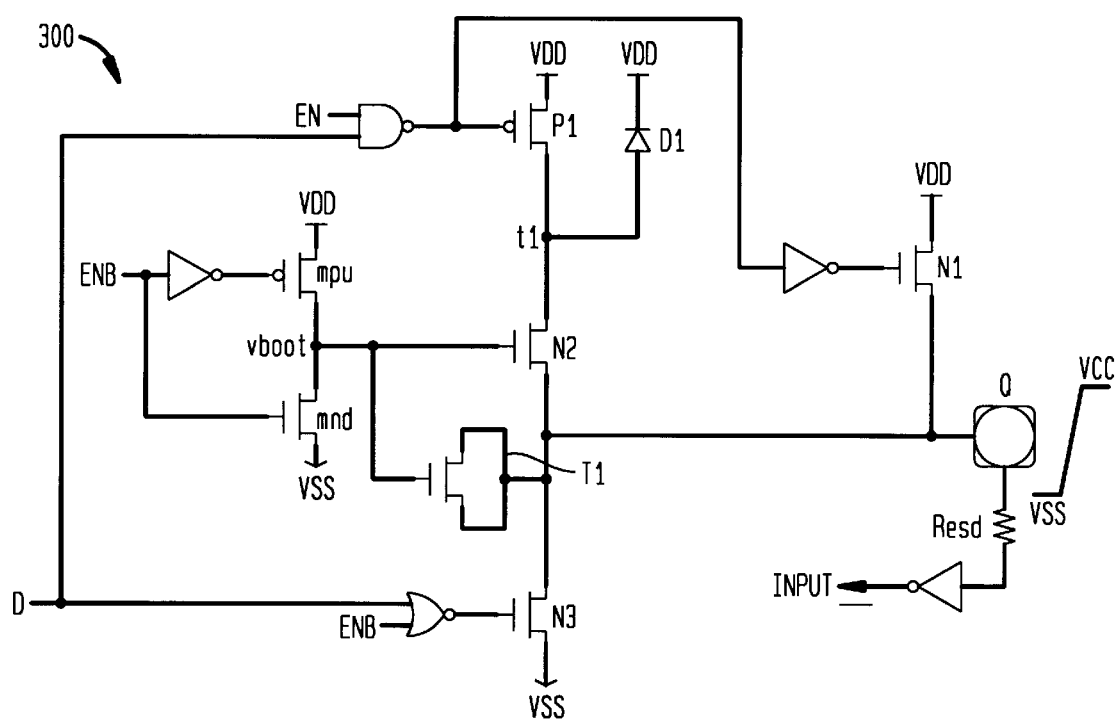
FIG. 6 shows an alternate bidirectional multi-voltage buffer according to the first embodiment of the present invention.

As indicated, an important aspect of this invention is the 'bootstrap' capacitor technique. Bootstrap capacitor Cboot may be implemented in buffer 300 by simply making use of the inherent overlapped capacitance CGSov (the gate-to-source overlapped capacitance) in transistor N2. Since NMOS pull-up transistors typically have large widths, e.g., 100 μm, the resultant overlapped capacitance CGSov is generally large enough for proper circuit function. However, if the overlapped capacitance CGSov is not sufficient, an additional transistor T1 can be simply inserted (preferably in series with transistor N2) as shown in FIG. 6.

Figure 7:
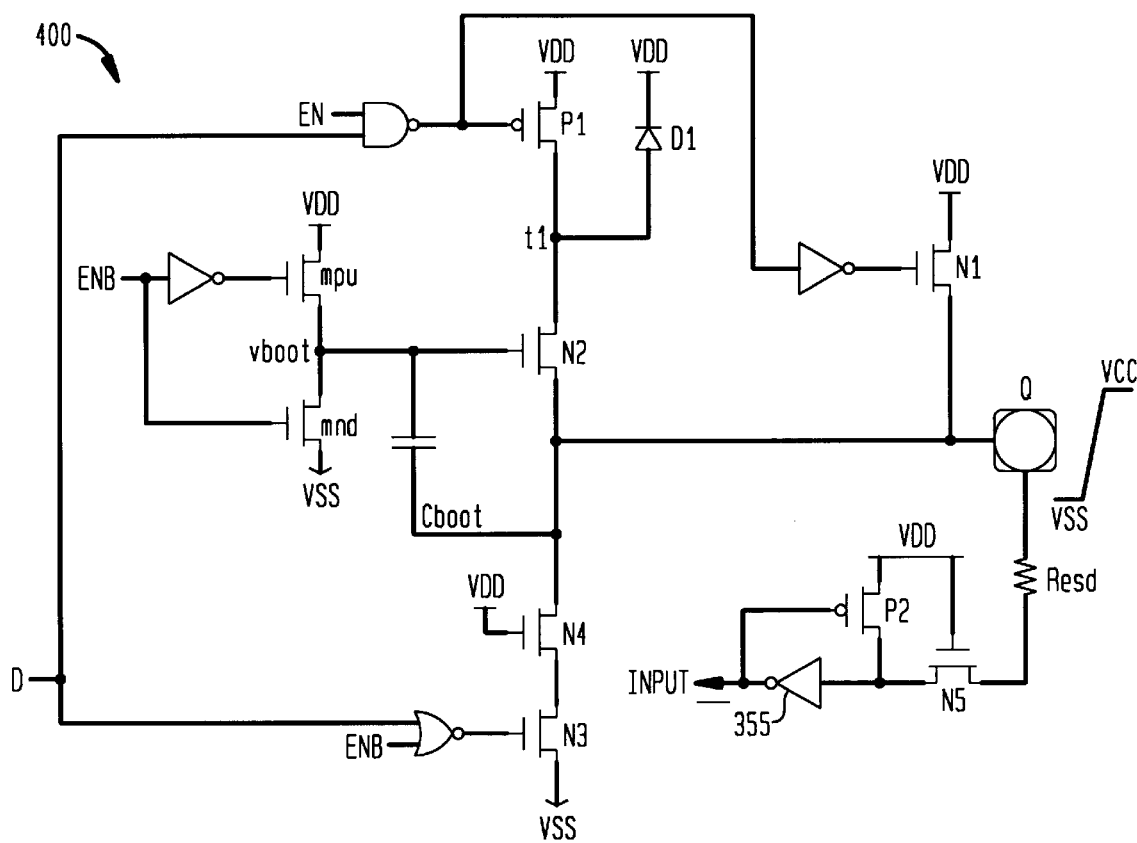
FIG. 7 shows a bidirectional multi-voltage buffer according to a second embodiment of the present invention.

FIG. 7 shows a bidirectional multi-voltage buffer circuit 400 according to a second embodiment of the present invention. Buffer 400 is similar to buffer 300 of FIG. 5, except transistors N4 and P2/N5 are inserted in the output buffer and input buffer portions, respectively, for improving the circuit reliability and to reduce the stress voltages applied to the drain of transistor N3 and the gate of the input buffer invertor 355, respectively.

Figure 8:
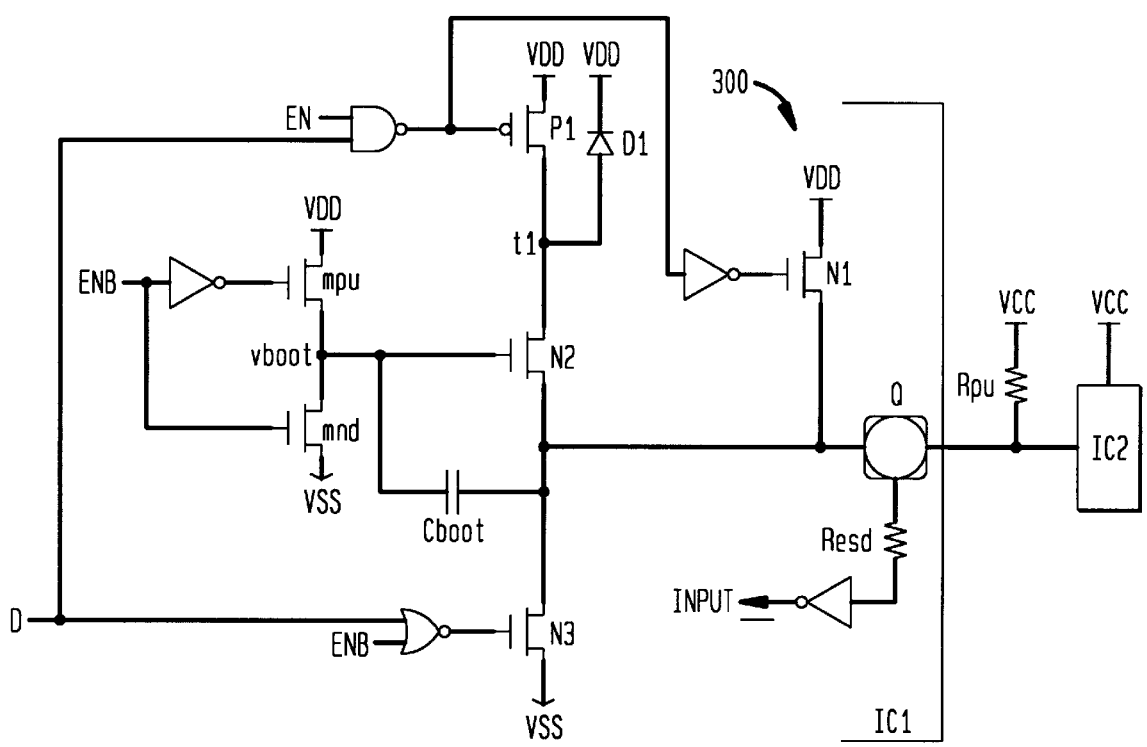
FIG. 8 shows a bidirectional multi-voltage buffer according to a third embodiment of the present invention.

FIG. 8 shows bidirectional multi-voltage buffer circuit 300 connected to an IC2 via a pull-up resistor according to a third embodiment of the present invention. In this embodiment, buffer 300 resides in IC1 and shares the same bus with the output bus driver in IC2 through a pull-up resistor Rpu. To ensure proper circuit operation, the voltage level at node vboot is 'bootstrapped' under (VDD+Vt(of N2)+$V_{diodedrop}$). By such a design constraint, parasitic diode D1 is ensured to always be in an off state, which reduces any interface concerns between IC1 and IC2.

Voltage over time simulation results for 3.3 V/5 V and 5 V/12 V applications of the circuit of FIG. 5 are shown in FIGS. 9 and 10, respectively. Transistor sizes are P1=100/1, N2=100/1, N3=200/1, N1=200/1, mnd=2/8 and mpu=4/1, respectively (in units of μm). Signals vboot, t1, D, Q and EN, EN1 are presented. EN is the control signal of IC1, while EN1 is the control signal of IC2. When buffer 300 is in its output mode, EN=1 and EN1=1. Otherwise, EN=0 and EN1=0 in the input mode, as indicated in FIGS. 9 and 10.

Finally, the above-discussion is intended to be merely illustrative of the invention. Numerous alternative embodiments may be devised by those having ordinary skill in the art without departing from the spirit and scope of the following claims.

The claimed invention is:

1. An output buffer for connecting a first device supplied with a first voltage to a second device supplied with a second voltage, comprising:

a first driver for driving a terminal pad up to said second voltage;

a second driver for driving said terminal pad down to a voltage VSS;

at least one pair of push-pull bootstrap control transistors, connected to said first driver, for driving up said first driver to a voltage level based on a bootstrap capacitor having a predetermined capacitance, wherein the voltage level at a node between each said at least one pair of bootstrap control transistors is geater than the sum of said second voltage and a predetermined threshold voltage of said first driver.

2. The output buffer of claim 1, wherein said capacitor has first and second terminals, where said first terminal is connected between said bootstrap control transistors and said first driver and said second terminal is connected between said first and second drivers.

3. The output buffer of claim 2, wherein said first driver comprises a PMOS first driver transistor and an NMOS first driver transistor connected in series at a node t1.

4. The output buffer of claim 3, further comprising a parasitic diode connected in parallel at a node t1 between said PMOS and NMOS first driver transistors.

5. The output buffer of claim 3, wherein said first terminal is connected between said pair of bootstrap control transistors and the gate of said NMOS first driver transistor.

6. The output buffer of claim 5, wherein said second driver comprises an NMOS second driver transistor.

7. The output buffer of claim 6, wherein said second terminal is connected between the source of said NMOS first driver transistor and said drain of said NMOS second driver transistor.

8. The output buffer of claim 2, where said first driver comprises a PMOS and a first NMOS transistor connected in sexies at a node t1 and a second NMOS transistor having a gate connected to a gate of said PMOS transistor.

9. The output buffer of claim 1, further comprising:
 a first predriver circuit, connected to said first driver; and
 a second predriver circuit, connected to said second driver.

10. The output buffer of claim 9, wherein said first predriver is a NAND gate and said second predriver is a NOR gate.

11. The output buffer of claim 1, wherein said first voltage is greater than or equal to said second voltage.

12. The output buffer of claim 3, wherein said capacitor is formed from the inherent overlapped capacitance of said NMOS first driver transistor.

13. The output buffer of claim 3, wherein said capacitor is formed from an additional CMOS transistor connected in series with said NMOS first driver transistor.

14. The output buffer of claim 6, fiter comprising a third NMOS transistor having a drain connected to a source of said NMOS first driver transistor and having a source connected to a drain of said NMOS second driver transistor, for improving stress voltages applied to the drain of said NMOS second driver transistor.

15. The output buffer of claim 4, wherein said output buffer is formed on a first integrated circuit, such that said terminal pad of said output buffer is connected to an output driver of a second integrated circuit through a pull-up resistor.

16. The output buffer of claim 15, wherein the voltage level between said pair of bootstrap control transistors is less than the sum of said second voltage level, a predetermined threshold voltage of said NMOS first driver transistor and the voltage drop across said diode.

17. A bidirectional buffer for connecting a first device supplied with a first voltage to a second device supplied with a second voltage, comprising:
 an output portion having:
  a first driver for driving a terminal pad up to said second voltage;
  a second driver for driving said terminal pad down to a voltage VSS;
  at least one pair of push-pull bootstrap control transistors, connected to said first driver, for driving up said first driver to a voltage level due to the effect of a bootstrap capacitor having a predetermined capacitance, wherein the voltage level at a node between each said at least one pair of bootstrap control transistor is greater than the sum of said second voltage and a predetermined threshold voltage of said first driver, and
 an input portion, connected to the first and second drivers, for receiving signals from a bonding pad.

18. The bidirectional buffer of claim 17, wherein said input portion includes an invertor and a protection resistor for protecting said invertor from static charges.

19. The bidirectional buffer of claim 18, wherein said input portion further includes an NMOS transistor, having its gate connected to said second voltage source and one of its drain and source connected to said protection resistor and the other of its drain and source connected to said invertor, for reducing stress voltages applied to said invertor.

20. The bidirectional buffer of claim 17, wherein said capacitor has first and second terminals, where said first terminal is connected between said bootstrap control transistors and said first driver and said second terminal is connected between said first and second drivers.

21. The bidirectional buffer of claim 20, wherein said first driver comprises a PMOS first driver transistor and an NMOS first driver transitor connected in series at a node t1.

22. The bidirectional buffer of claim 21, further comprising a parasitic diode connected in parallel at a node t1 between said PMOS and NMOS first driver transistors.

23. The bidirectional buffer of claim 21, wherein said first terminal is connected between said pair of bootstrap control transistors and the gate of said NMOS first driver transistor.

24. The bidirectional buffer of claim 23, wherein said second driver comprises an NMOS second driver transistor.

25. The bidirectional buffer of claim 24, wherein said second terminal is connected between the source of said NMOS first driver transistor and said drain of said NMOS second driver transistor.

26. The bidirectional buffer of claim 20, wherein said first driver comprises a PMOS and a first NMOS transitor connected in series at a node t1 and a second NMOS transistor having a gate connected to a gate of said PMOS transistor.

27. The bidirectional buffer of claim 17, further comprising:
 a first predriver circuit, connected to said first driver; and
 a second predriver circuit, connected to said second driver.

28. The bidirectional buffer of claim 27, wherein said first predriver is an NAND gate and said second predriver is an NOR gate.

29. The bidirectional buffer of claim 17, wherein said first voltage is greater than or equal to said second voltage.

30. The bidirectional buffer of claim 21, wherein said capacitor is formed from the inherent overlapped capacitance of said NMOS first driver transistor.

31. The bidirectional buffer of claim 21, wherein said capacitor is formed from an additional CMOS transitor connected between said NMOS-second driver transistor and said NMOS first driver transistor.

32. The bidirectional buffer of claim 23, futher comprising a third NMOS transistor havig a drain connected to a source of said NMOS first driver transistor and having a source connected to a drain of said NMOS second driver transistor, for improving stress voltages applied to the drain of said NMOS second driver transistor.

33. The bidirectional buffer of claim 22, wherein said bidirectional buffer is formed on a first integrated circuit, such that said terminal pad of said bidirectional buffer is connected to an output driver of a second integrated circuit through a pull-up resistor.

34. The bidirectional buffer of claim 33, wherein the voltage level between said pair of bootstrap control transistors is less than the sum of said second voltage level, a predetermined threshold voltage of said NMOS first driver transistor and the voltage drop across said diode.

\* \* \* \* \*